US006934170B2

(12) United States Patent
Ooishi

(10) Patent No.: US 6,934,170 B2
(45) Date of Patent: Aug. 23, 2005

(54) AC ADAPTOR INTEGRAL-TYPE HOUSEHOLD-POWER-LINE COUPLER

(75) Inventor: Mutsuhiko Ooishi, Iizuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 134 days.

(21) Appl. No.: 10/615,855

(22) Filed: Jul. 9, 2003

(65) Prior Publication Data

US 2004/0009709 A1 Jan. 15, 2004

(30) Foreign Application Priority Data

Jul. 10, 2002 (JP) ....................................... 2002-200961

(51) Int. Cl.$^7$ ............................ H02M 1/00; H05K 5/00

(52) U.S. Cl. ....................................... 363/146; 361/683

(58) Field of Search ................................ 363/144, 146; 439/527, 535, 536, 638, 650, 660; 361/679, 683

(56) References Cited

U.S. PATENT DOCUMENTS 4,131,805 A * 12/1978 Austin et al. ............... 307/147
6,358,096 B1 * 3/2002 Beckman .................... 439/638
6,597,557 B2 * 7/2003 Hunter ....................... 361/118
6,790,077 B1 * 9/2004 Chen .......................... 439/502
2003/0185027 A1 10/2003 Yokoo et al. ................ 363/81

* cited by examiner

*Primary Examiner*—Matthew V. Nguyen
(74) *Attorney, Agent, or Firm*—Stevens, Davis, Miller & Mosher, LLP

(57) ABSTRACT

An object is to provide a compact AC adaptor integral-type household-power-line coupler capable of simplifying a structural arrangement of an apparatus containing a communication terminal, and also capable of improving a handling characteristic and an outer appearance thereof. The AC adaptor integral-type household-power-line coupler is arranged by employing a household-power-line power converting/supplying unit 7 connected to a plug unit 4, for supplying electric power to a communication terminal, the plug unit being employed to be coupled to a household-power-line plug socket; a household-power-line carrier signal coupling unit 8 for inputting/outputting a signal via the plug unit 4 to the communication terminal; and a casing unit 6 containing thereinto both the household-power-line power converting/supplying unit 7 and the household-power-line carrier signal coupling unit 8.

10 Claims, 3 Drawing Sheets

AC ADAPTOR INTEGRAL-TYPE HOUSEHOLD-POWER-LINE COUPLER

BACKGROUND OF THE INVENTION

1. Field of the Invention

The present invention is related to an AC adaptor integral-type household-power-line coupler applied to a household-power-line communication apparatus, capable of simply constructing a local area network (LAN) in low cost.

2. Description of Related Art

Recently, strong needs for constructing local area networks (LANs) in simple manners and in low cost have been made in small-scalled offices and homes.

Conventionally, in order to constitute local area networks, methods for installing leased communication lines have been conducted. On the other hand, there is another trend that wireless communication and household power lines (electric light lines) are employed without using the leased communication lines in order to establish local area networks. Then, this trend is gradually increased. In household-power-line communications, household-power-line converting/supplying units (AC adaptors etc.) for supplying electric power to communication appliances capable of performing communications, and also, household-power-line carrier signal coupling units (household-power-line couplers) for transmitting/receiving communication signals to/from household power lines must be prepared respectively.

A conventional household-power-line communication appliance will now be explained. FIG. 1 is a structural diagram of this conventional household-power-line communication appliance. In this drawing, a communication terminal 1 is connected to an AC adaptor 2, a household-power-line modem 5, and a household-power-line coupler 3. The AC adaptor 2 supplies electric power to the communication terminal 1. The household-power-line modem 5 modulates and/or demodulates a communication signal. The household-power-line coupler 3 transmits/receives a communication signal to/from the household power line. In the case that a household-power-line communication is carried out, the AC adaptor 2, the household-power-line modem 5, and the household-power-line coupler 3 are connected to the communication terminal 1 so as to be used.

However, the above-explained conventional method and LAN constructing method owe the following problems:

(1) To perform a household-power-line communication by the communication terminal 1, the AC adaptor 2, the household-power-line modem 5, and the household-power-line coupler 3 must be separately connected to the communication terminal 1. Accordingly, the cumbersome connecting operations are necessarily required. Thus, there is such a problem that handling characteristics and operability are deteriorated in the case that the communication terminal 1 is moved.

(2) At least two sets of household-power-line plug units are required which are occupied by these units, so that wiring lines are made complicated. Therefore, there are problems that outer appearances are deteriorated and designing senses are also deteriorated.

SUMMARY OF THE INVENTION

The present invention has been made to solve the above-explained problems, and therefore, has an object to provide such a compact AC adaptor integral-type household-power-line coupler capable of simplifying a structural arrangement of an apparatus containing a communication terminal, and also capable of improving a handling characteristic and an outer appearance thereof.

To solve the above-described problems, an AC adaptor integral-type household-power-line coupler, according to the present invention, is featured by comprising: a household-power-line power converting/supplying unit connected to a plug unit, for supplying electric power to a communication terminal, the plug unit being employed to be coupled to a household-power-line plug socket; a household-power-line carrier signal coupling unit for inputting/outputting a signal via the plug unit to the communication terminal; and a casing unit containing thereinto both the household-power-line power converting/supplying unit and the household-power-line carrier signal coupling unit. As a consequence, the structural arrangement of the apparatus containing the communication terminal can be made simpler and compact, resulting in improvements of handling characteristics and superior appearances.

DETAILED DESCRIPTION OF THE PREFERRED EMBODIMENTS

Referring now to drawings, various embodiment of the present invention will be described.

[First Embodiment]

Figure 1:
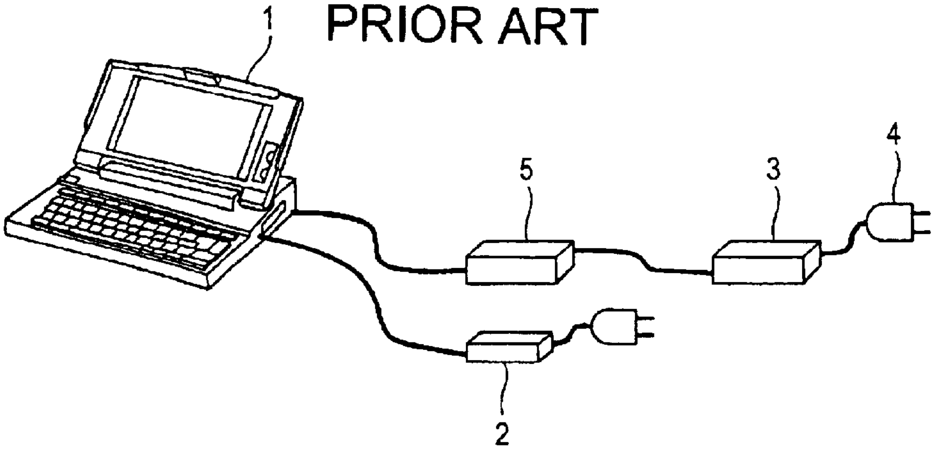
FIG. 1 PRIOR ART
FIG. 1 is a structural diagram of the conventional household-power-line communication appliance.
Figure 2:
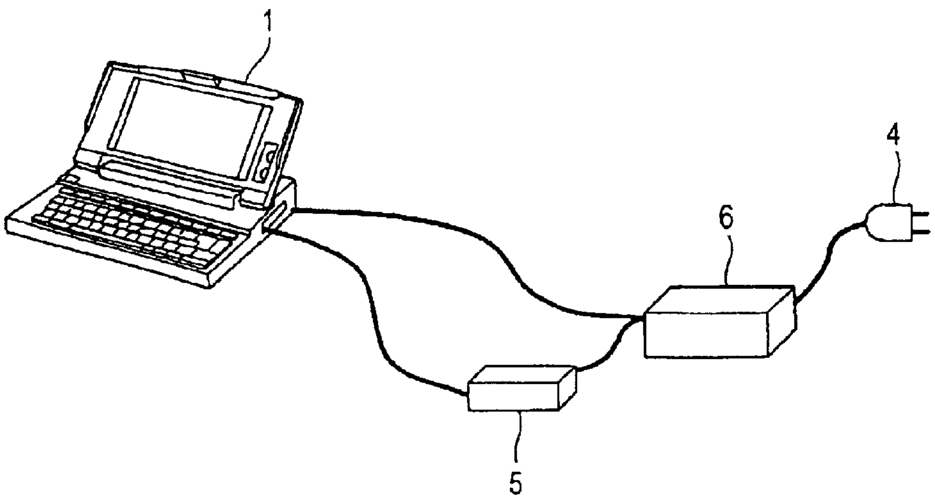
FIG. 2 is a structural diagram for showing a household-power-line communication appliance to which an AC adaptor integral-type household-power-line coupler according to a first embodiment of the present invention is applied.

FIG. 2 is a structural diagram of a household-power-line communication appliance to which an AC adaptor integral-type household-power-line coupler according to a first embodiment of the preset invention is applied.

In FIG. 2, reference numeral 1 shows a communication terminal which processes signals transmitted via a household power line, reference numeral 5 indicates a household-power-line modem, reference numeral 6 represents a casing unit of an AC adaptor integral-type household-power-line coupler, and reference numeral 4 shows a plug unit of the AC adaptor integral-type household-power-line coupler, which is connected to a plug socket (receptacle) of the household power line. Within the AC adaptor integral-type household-power-line coupler, both a household-power-line coupler and a household-power-line power converting/supplying unit are built. This household-power-line coupler corresponds to a household-power-line carrier signal coupling unit for transmitting/receiving unit which transmits/receives a household-power-line communication signal to/from the household power line. The household-power-line power converting/supplying unit supplies driving power to the communication terminal 1.

Figure 3:
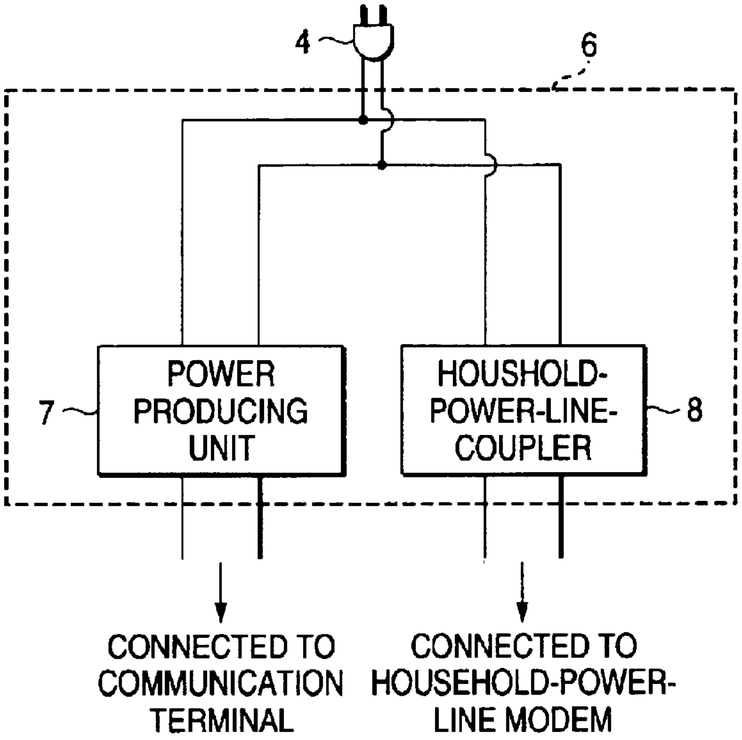
FIG. 3 is a block diagram for schematically indicating the AC adaptor integral-type household-power-line coupler of the first embodiment of the present invention.

FIG. 3 is a block diagram for schematically indicating the AC adaptor integral-type household-power-line coupler of the first embodiment of the present invention. In FIG. 3, reference numeral 6 indicates the casing unit that contains the below-mentioned units in an integral form. Reference numeral 7 shows the household-power-line power converting/supplying unit (namely, power producing unit) connected to the plug unit 4. Reference numeral 8 indicates a household-power-line coupler that is connected in parallel to the power producing unit 7.

A description will now be made of operations with respect to the AC adaptor integral-type-household-power-line coupler with employment of the above-described arrangement, according to the first embodiment. While the plug unit 4 is connected to a household-power-line plug socket (receptacle; not shown), this AC adaptor integral-type household-power-line coupler is arranged in such a manner that commercial AC power used to drive the communication terminal 1 is obtained by the power producing unit 7, and at the same time, signals for a household-power-line communication purpose are transmitted/received by the household-power-line coupler 8.

In other words, the power producing unit 7 connected to the plug unit 4 produces electric power required in the communication terminal 1 from the commercial AC power supply, and then, supplies the produced electric power to the communication terminal 1. Also, the household-power-line coupler 8 which is similarly connected to the plug unit 4 is connected to the household-power-line modem 5 used for the household-power-line communication purpose.

As a consequence, the household-power-line coupler 8 extracts signals for the household-power-line communication purpose from the plug unit 4, and then, supplies these extracted signals to the household-power-line modem 5 in the reception mode. The household-power-line coupler 8 superimposes the signals received from the household-power-line modem 5 on the household power line in the transmission mode.

Since the AC adaptor integral-type household-power-line coupler of the first embodiment is arranged in the above-described manner, this coupler may have the following effects.

(a) Since the power producing unit 7 and the household-power-line coupler 8 are built in the casing unit 6, the wiring lines provided in the vicinity of the communication terminal 1 can be made simpler, resulting in improvements of handling characteristics and better appearances.

(b) Since the household-power-line coupler 8 is assembled in the casing unit 6, there is such an effect that a total number of electronic appliances that are required when the household-power-line communication is carried out can be reduced.

(c) Since only one set of household-power-line plug socket to be connected to this AC adaptor integral-type household-power-line coupler is merely required, the communication apparatus can be set in a very easy manner, and the superior maintenance characteristic such as inspections and cleaning of peripheral units as to the plug socket can be realized.

(d) Since the household-power-line coupler 8 may also be operated by the electric power supplied from the power producing unit 7 built in the casing unit 6, the AC adaptor integral-type household-power-line coupler can be operated in a higher efficiency.

(Second Embodiment)

Figure 4:
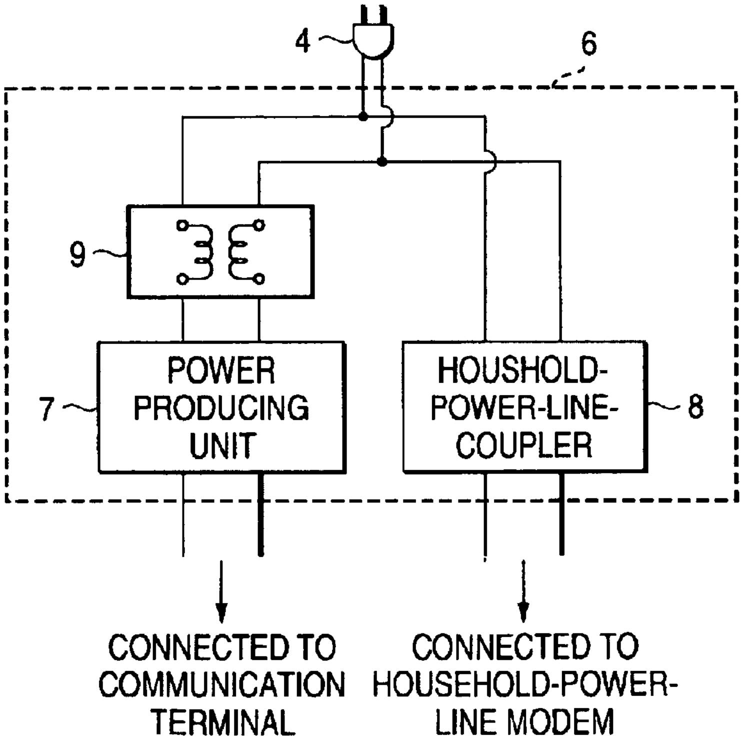
FIG. 4 is a block diagram for schematically representing an AC adaptor integral-type household-power-line coupler according to a second embodiment of the present invention.

FIG. 4 is a block diagram for schematically indicating the AC adaptor integral-type household-power-line coupler of a second embodiment of the present invention. In FIG. 4, reference numeral 6 indicates the casing unit which contains the below-mentioned units in an integral form. Reference numeral 7 shows the household-power-line power converting/supplying unit (namely, power producing unit) connected to the plug unit 4. Reference numeral 8 indicates a household-power-line coupler which is connected in parallel to the power producing unit 7. Reference numeral 9 represents a filter unit which is connected/arranged between the power producing unit 7 and the plug unit 4 connected to a household-power-line plug socket (not shown). This power producing unit 7 supplies electric power to the communication terminal 1.

It should be noted that the AC adaptor integral-type household-power-line coupler according to the second embodiment owns such a different technical point that the above-described filter unit 9 is added to the AC adaptor integral-type household-power-line coupler according to the first embodiment.

Operations of the AC adaptor integral-type household-power-line coupler with employment of the above-described arrangement, according to the second embodiment, will now be explained.

While the plug unit 4 is connected to the household-power-line plug socket (not shown), this plug unit 4 may receive the commercial AC electric power (power supply voltage), and may transmit/receive signals used for household-power-line communications at the same time. As the filter unit 9 connected to the plug unit 4, the following filter unit having such a filtering characteristic is used. That is, this filter unit may pass therethrough signals having low frequencies lower than, or equal to 500 KHz such as commercial AC signals, but may not pass therethrough signals having high frequencies such as signals used for household-power-line communications. The high frequencies of these communication signals correspond to frequency bands defined from 1 MHz to 30 MHz. This filter unit 9 may represent high impedances with respect to these high frequency bands. In order to have such a filtering characteristic, a choke coil, an LC filter, and the like may be utilized.

When a choke coil is employed, since both a material of a core and a turn number of a winding are changed which constitute this choke coil, a frequency band may be adjusted in which this choke coil may represent a high impedance.

Also, this filter unit 9 may own such a characteristic capable of not leaking high-frequency noise produced from the power producing unit 7 outside the own filter unit 9. As explained above, since the filter unit 9 is inserted into the AC adaptor integral-type household-power-line coupler, the power producing unit 7 can hardly give adverse influences to the signals used for the household-power-line communications. This power producing unit 7 may produce electric power required in the communication terminal 1 from the commercial AC power filtered by this filter unit 9.

Since the AC adaptor integral-type household-power-line coupler of the second embodiment is arranged as explained above, this coupler owns the below-mentioned effects in addition to the effects of the first embodiment mode.

(a) Since the filter unit 9 is equipped, the noise produced from the power producing unit 7 which is parallel-connected to the household-power-line coupler 8 may be eliminated by the filter unit 9, and highspeed communications can be carried out between the communication terminal 1 and the household-power-line coupler 8.

(b). Since the filter unit 9 may have the high impedance with respect to the high frequency signals used in the household-power-line communications, it is possible to avoid that these high frequency signals flows into the household-power-line power converting/supplying unit 7. As a result, a ratio of signal to noise power can be maintained at a high ratio value, and a highspeed communication can be carried out.

(Third Embodiment)

Figure 5:
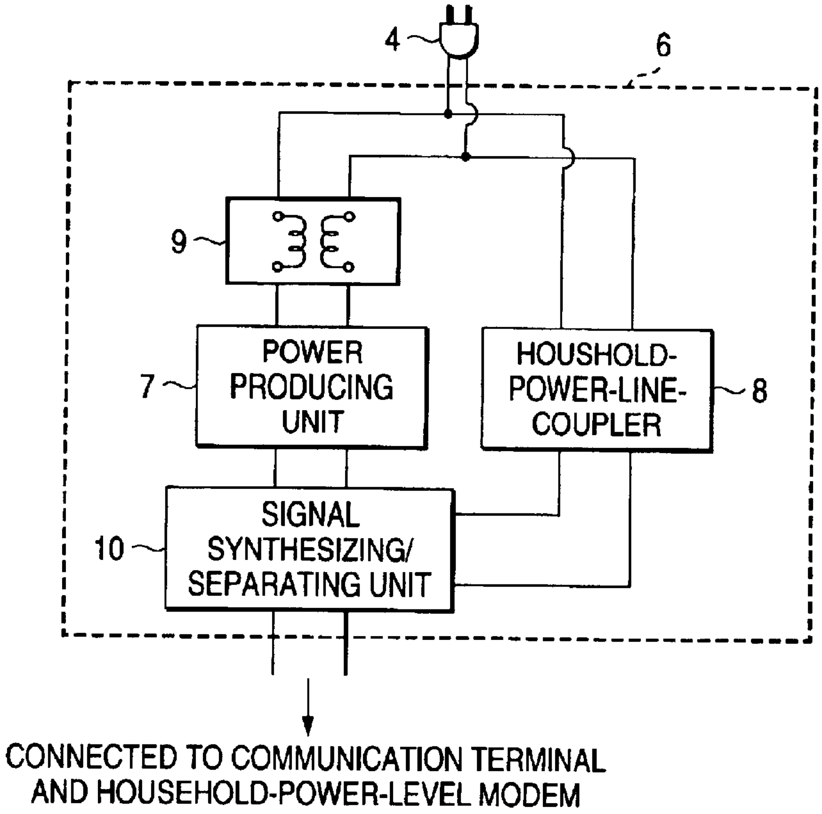
FIG. 5 is a block diagram for schematically representing an AC adaptor integral-type household-power-line coupler according to a third embodiment of the present invention.

FIG. 5 is a block diagram for schematically indicating an AC adaptor integral-type household-power-line coupler of a third embodiment of the present invention. In FIG. 5, reference numeral 6 shows a casing unit that contains the below-mentioned units in an integral form. Reference numeral 7 shows a household-power-line power converting/supplying unit (namely, power producing unit) connected to a plug unit 4. Reference numeral 8 indicates a household-power-line coupler that is connected in parallel to a power producing unit 7. Reference numeral 9 represents a filter unit that is connected/arranged between the power producing unit 7 and the plug unit 4 connected to a household-power-line plug socket (not shown). This power producing unit 7 supplies electric power to the communication terminal 1. Also, reference numeral 10 indicates a signal synthesizing/separating unit that is connected to both the power producing unit 7 and the household-power-line coupler 8.

It should be noted that the AC adaptor integral-type household-power-line coupler according to the third embodiment owns such a different technical point that the above-described signal synthesizing/separating unit 10 is added to the AC adaptor integral-type household-power-line coupler according to the second embodiment.

Operations of the AC adaptor integral-type household-power-line coupler with employment of the above-described arrangement, according to the third embodiment, will now be explained. While the plug unit 4 is connected to the household-power-line plug socket (not shown), this plug unit 4 may receive the commercial AC electric power (power supply voltage), and may transmit/receive signals used for household-power-line communications at the same time. The filter unit 9 connected to the plug unit 4 owns such a filtering characteristic. That is, this filter unit 9 may pass therethrough signals having low frequencies such as commercial AC signals, but may become a high impedance with respect to signals used for household-power-line communications in a high frequency band, so that this filter unit 9 may not pass therethrough such high frequency signals. Also, this filter unit 9 may own such a characteristic capable of not leaking high-frequency noise produced from the power producing unit 7 outside the own filter unit 9. As explained above, since the filter unit 9 is inserted into the AC adaptor integral-type household-power-line coupler, the power producing unit 7 can hardly give adverse influences to the signals used for the household-power-line communications. In this case, the filter unit 9 is constituted by a choke coil, or the like. This power producing unit 7 may produce electric power required in the communication terminal 1 from the commercial AC power filtered by this filter unit 9.

Also, the household-power-line coupler 8 that is similarly connected to the plug unit 4 extracts signals used for household-power-line communications from the household power line in a signal reception mode, and superimposes signals on the household power line in a signal transmission mode.

The signal synthesizing/separating unit 10 synthesizes a DC voltage supplied from the power producing unit 7 with a high frequency signal derived from the household-power-line coupler 8 while signals are received from the household power line, and then, outputs the synthesized signal to a cable which is connected to another signal synthesizing/separating unit (not shown) provided on the side of the communication terminal 1. Since the high frequencies of the signals for the household-power-line communications are different from the DC voltage on the side of the communication terminal 1, the signals can be separated from the DC voltage by the above-explained signal synthesizing/separating unit (not shown).

In the signal transmission mode, this signal synthesizing/separating unit 10 extracts the high frequency signals used for the household-power-line communication from such a signal derived from the signal synthesizing/separating unit (not shown) provided on the side of the communication terminal 1, and then, supplies this extracted high frequency signal to the household-power-line coupler B. For example, the signal synthesizing/separating unit 10 employs a choke coil, or the like, while this choke coil may pass therethrough low frequency signals derived from the household power line, but may not pass therethrough high frequency signals such as the signals used for the household-power-line communications.

Since the AC adaptor integral-type household-power-line coupler of the third embodiment is arranged as explained above, this coupler owns the below-mentioned effects in addition to the effects of the first and second embodiment modes.

The signal synthesizing/separating unit 10 capable of superimposing/separating the high frequency signals derived from the household-power-line coupler 8 on the same cable is held in the internal manner within the casing unit 6 in addition to the power producing unit 7 and the household-power-line coupler 8. As a result, a total number of cables used to connect the AC coupler adaptor internal-type household-power-line coupler to the communication terminal 1 can be reduced to 1, so that the handling characteristic of this coupler can be furthermore improved.

(Fourth Embodiment)

Figure 6:
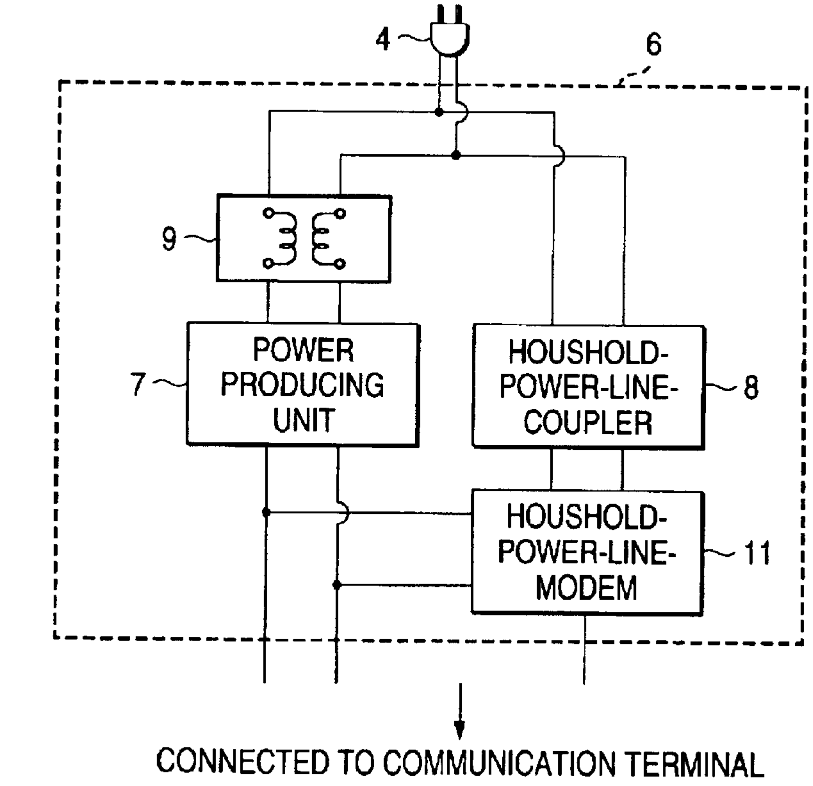
FIG. 6 is a block diagram for schematically representing an AC adaptor integral-type household-power-line coupler according to a fourth embodiment of the present invention.

FIG. 6 is a block diagram for schematically indicating an AC adaptor integral-type household-power-line coupler of a fourth embodiment of the present invention. In FIG. 6, reference numeral 6 shows a casing unit that contains the below-mentioned units in an integral form. Reference numeral 7 shows a household-power-line power converting/supplying unit (namely, power producing unit) connected to a plug unit 4. Reference numeral 8 indicates a household-power-line coupler that is connected in parallel to a power producing unit 7. Reference numeral 9 represents a filter unit that is connected/arranged between the power producing unit 7 and the plug unit 4 connected to a household-power-line plug socket (not shown). This power producing unit 7 supplies electric-power to the communication terminal 1. Also, reference numeral 11 shows a household-power-line modem which is connected to the household-power-line coupler 8 and is built in the casing unit 6.

It should be noted that the AC adaptor integral-type household-power-line coupler according to the fourth embodiment owns such a different technical point that the above-described household-power-line modem 11 is added to the AC adaptor integral-type household-power-line coupler according to the second embodiment.

Operations of the AC adaptor integral-type household-power-line coupler with employment of the above described arrangement, according to the fourth embodiment, will now be explained. While the plug unit 4 is connected to the household-power-line plug socket (not shown), this plug unit 4 may receive the commercial AC electric power (power supply voltage), and may transmit/receive signals used for household-power-line communications at the same time. While the household-power-line coupler 8 is connected to the plug unit 4 in parallel to both the power producing unit 7 and the filter unit 9, this household-power-line coupler 8 extracts signals used for household-power-line communications from the household power line in a signal reception mode, and super imposes signals on the household power line in a signal transmission mode. While the household-power-line modem 11 is connected to the household-power-line coupler 8, this household-power-line modem 11 modulates/demodulates signals used for household-power-line communications. The household-power-line modem 11 is connected via a USB (Universal Serial Bus) cable, or an Ethernet cable to the communication terminal 1. Since the AC adaptor integral-type household-power-line coupler of the fourth embodiment is arranged as above, a total number of such an electronic appliance required in the case that the household-power-line communications are carried out can be reduced to 1.

Since the AC adaptor integral-type household-power-line coupler of the fourth embodiment is arranged as explained above, this coupler owns the below-mentioned effects in addition to the effects of the first and second embodiment modes.

(a) Since the household-power-line modem 11 is equipped into the casing unit 6, there is such an effect that a total number of the electronic appliances required to perform the household-power-line communications can be further reduced.

(d) Since the household-power-line coupler 8 and the like may be operated by the electric power supplied from the power producing unit 7 built in the casing unit 6, the circuit arrangement can be made simple, and the AC adaptor integral-type household-power-line coupler can be operated in a higher efficiency.

What is claimed is:

1. An AC adaptor integral-type household-power-line coupler comprising:

a household-power-line power converting/supplying unit connected to a plug unit, for supplying electric power to a communication terminal, said plug unit being employed to be coupled to a household-power-line plug socket;

a household-power-line carrier signal coupling unit that inputs a signal from a power line via said plug unit to said communication terminal and that outputs a signal to a power line via said plug unit from the communication terminal; and a casing unit that contains therein both said household-power-line power converting/supplying unit and said household-power-line carrier signal coupling unit.

2. An AC adaptor integral-type household-power-line coupler according to claim 1, wherein said household-power-line power converting/supplying unit is parallel-connected to said household-power-line carrier signal coupling unit.

3. An AC adaptor integral-type household-power-line coupler according to claim 1, further comprising a filter unit for removing noise and which is connected between said plug unit and said household-power-line power converting/supplying unit.

4. An AC adaptor integral-type household-power-line coupler according to claim 3, wherein said filter unit passes therethrough a low frequency signal, and owns a high impedance value in a high frequency range.

5. An AC adaptor integral-type household-power-line coupler according to claim 4, wherein said filter unit passes therethrough a signal having a frequency range lower than, or equal to 500 KHz.

6. An AC adaptor integral-type household-power-line coupler according to claim 4, wherein said filter unit is a choke coil.

7. An AC adaptor integral-type household-power-line coupler according to claim 4, wherein said filter unit is an LC filter.

8. An AC adaptor integral-type household-power-line coupler according to claim 1 or 3, further comprising:

a signal synthesizing/separating unit for superimposing/separating a high frequency signal outputted from said household-power-line carrier signal coupling unit to a DC voltage outputted from said household-power-line power converting/supplying unit.

9. An AC adaptor integral-type household-power-line coupler according to claim 8, wherein said signal synthesizing/separating unit is a choke coil.

10. An AC adaptor integral-type household-power-line coupler according to any one of claim 1 to claim 3, wherein said household-power-line carrier signal coupling unit further comprises a household-power-line modem for executing both a modulating operation and a demodulating operation; and said household-power-line modem is driven by electric power supplied from said household-power-line power converting/supplying unit.

* * * * *